(12) United States Patent
Bretschneider et al.

(10) Patent No.: US 7,178,354 B2
(45) Date of Patent: Feb. 20, 2007

(54) ENCLOSURE OR EQUIPMENT CABINET AND SEALING ARRANGEMENT THEREFOR

(75) Inventors: Rainer Bretschneider, Meissen (DE); Lars Gallasch, Löthain (DE)

(73) Assignee: Knurr AG, Arnstorf (DE)

( * ) Notice: Subject to any disclaimer, the term of this patent is extended or adjusted under 35 U.S.C. 154(b) by 147 days.

(21) Appl. No.: 10/490,657

(22) PCT Filed: Sep. 30, 2002

(86) PCT No.: PCT/EP02/10944

§ 371 (c)(1),
(2), (4) Date: Mar. 25, 2004

(87) PCT Pub. No.: WO03/037055

PCT Pub. Date: May 1, 2003

(65) Prior Publication Data

US 2005/0016195 A1    Jan. 27, 2005

(30) Foreign Application Priority Data

Oct. 18, 2001  (DE) .............................. 101 51 460

(51) Int. Cl.
F25D 23/12  (2006.01)
(52) U.S. Cl. ..................... 62/259.1; 62/262
(58) Field of Classification Search ............ 62/263, 62/440, 446, 447, 259.1, 262, 297, 298; 312/236, 312/257, 400, 257.1; 277/320, 920, 921, 277/930
See application file for complete search history.

(56) References Cited

U.S. PATENT DOCUMENTS

| | | | |
|---|---|---|---|
| 4,691,531 A * | 9/1987 | Clifton et al. ................. 62/263 |
| 4,755,630 A * | 7/1988 | Smith et al. ........... 174/35 MS |
| 5,184,879 A | 2/1993 | Brossardt et al. |
| 5,657,641 A | 8/1997 | Cunningham et al. |
| 5,720,147 A * | 2/1998 | Wenrick et al. .......... 52/745.06 |
| D412,566 S * | 8/1999 | Taras et al. ................ D23/354 |
| 5,971,511 A * | 10/1999 | Diebel et al. ............. 312/265.3 |
| 6,042,395 A * | 3/2000 | Munch et al. ................. 439/92 |
| 6,149,254 A * | 11/2000 | Bretschneider et al. .. 312/223.1 |
| 6,164,369 A | 12/2000 | Stoller |
| 6,241,331 B1 * | 6/2001 | Kammerl et al. ........ 312/265.5 |
| 6,298,681 B1 | 10/2001 | Esty et al. |
| 6,357,379 B1 * | 3/2002 | Murphy, Jr. ................. 114/361 |
| 6,428,127 B1 * | 8/2002 | Rasmussen ............... 312/265.4 |
| 6,662,588 B2 * | 12/2003 | Houk et al. ................... 62/298 |
| 6,742,583 B2 * | 6/2004 | Tikka .......................... 165/291 |
| 6,789,363 B1 * | 9/2004 | Frase et al. ................ 52/220.8 |
| 6,808,240 B2 * | 10/2004 | Altena ...................... 312/265.4 |
| 6,877,551 B2 * | 4/2005 | Stoller .......................... 165/47 |
| 6,889,752 B2 * | 5/2005 | Stoller .......................... 165/47 |

FOREIGN PATENT DOCUMENTS

| | | | |
|---|---|---|---|
| DE | 19531310 | | 2/1997 |
| WO | WO 97/47167 | * | 12/1997 |
| WO | WO 00/29685 | * | 5/2000 |

* cited by examiner

Primary Examiner—Mohammad M. Ali
(74) Attorney, Agent, or Firm—Jacobson Holman PLLC

(57) ABSTRACT

The invention relates to a sealing arrangement for an enclosure or equipment cabinet and to an attachable air conditioning device. In order to ensure a watertight, linear sealing of the air distribution spaces with the necessary protection level, sealing frames and seals cooperating therewith and appropriately an additional cover are provided between the air conditioning device and the covering part.

18 Claims, 5 Drawing Sheets

ENCLOSURE OR EQUIPMENT CABINET AND SEALING ARRANGEMENT THEREFOR

This is a nationalization of PCT/EP02/10944 filed Sep. 30, 2002 and published in German.

BACKGROUND OF THE INVENTION

1. Field of the Invention

The invention relates to a sealing arrangement for an enclosure or equipment cabinet and an attachable air conditioning device.

The invention is more particularly suitable for enclosures and equipment cabinets having a reception space for electrical and electronic equipment and components and which can be provided with at least one air conditioning device for removing the heat produced by the equipment and components and for maintaining a presettable temperature and therefore for ensuring a troublefree operation of the equipment and components.

2. Related Art

As air conditioning devices it is possible to fit or install heat exchangers, refrigerant cooling devices, Peltier elements and fans, for instance filter fans. The fitting or attachment of the at least one air conditioning device generally takes place in the area of a covering part of the equipment cabinet, e.g. a door, a side panel and/or an upper cover, which for this purpose are equipped with corresponding recesses for the removal of the air heated in the reception space and for supplying cooled air.

Particularly in the case of telecommunications equipment cabinets which are to a greater or lesser extent unprotected from environmental influences and atmospheric conditions when installed outdoors, the danger exists that foreign bodies, dust and in particular also water and humidity, can penetrate through a not adequately sealed connecting area between the air conditioning device and the covering part of the enclosure or equipment cabinet into an air distribution space, thereby impairing the function of the sensitive equipment and components.

With regards to the water resistance of outdoor equipment cabinets or enclosures manufacturers require an IP protection value of at least ×5, i.e. the equipment cabinets, which are hereinafter also understood to cover enclosures, must be able to withstand water in jet form and directed from any direction onto the cabinet. Hitherto when screwing down or otherwise connecting or joining air conditioning devices to a covering part of an equipment cabinet, there has been a flat pressing together of seals having a differing cross-section, e.g. a rectangular, semicircular or circular cross-section or combinations thereof, which can be solid or hollow, made from natural or artificial rubber, plastics or foams and which can also be enveloped. This gives rise to large bearing surfaces and associated therewith high contact pressures for a seal, so that unless further protective measures are adopted only protection value IP ×4 can be obtained. When forming the necessary corners or angles in the path of the seal additional risks arise for the sealing action in the case of cut seals in corner junctions or through beads when forming corners by bending round sealing profiles or sections.

DE 195 31 310 C2 discloses a switch cabinet with a heat exchanger incorporated into a wall element. The heat exchanger is constructed as a one-piece cooler with vertical cooling ribs projecting into the interior of the cabinet for an inner circuit and vertical, outside cooling ribs located on the outside of the cabinet. An inside cover for the inside cooling ribs is provided in spaced manner in an upper region. In this region is provided an inside fan, which sucks the air out of the cabinet interior and returns it to the latter through the inner ducts in the downwards direction and via air discharge nozzles or air ducts, which are positioned in an exhaust plate of the inside cover. Optionally the outside ducts can be covered by an outside covering. The fixing of the one-piece heat exchanger cooler takes place in the region of the side panels in punctiform manner to vertical cabinet sections.

U.S. Pat. No. 6,164,369 describes an outdoor cabinet, which has at least one door constructed as a heat exchanger. In the closed position an inner surface of the door engages on seals positioned on the cabinet side. Spaced from the inside door leaf is provided a cover, which has an air passage opening in an upper region. The inside door leaf is provided with an air passage opening in a lower region and cooperates with a further, cabinet-side opening in a lower chamber, in which in particular batteries can be positioned. At least one fan in the air passage opening of the door leaf brings about an air flow through the lower chamber and the double-wall door, so that there is a heat transfer or cooling of the upper chamber and the electrical equipment placed therein.

SUMMARY OF THE INVENTION

The object of the invention is to provide a sealing arrangement, which on fitting an air conditioning device to an equipment cabinet ensures the necessary sealing action at least against jet water from a nozzle coming from all directions in order to comply with IP ×5.

According to the invention the object is achieved by a sealing arrangement of an enclosure or equipment cabinet and an attachable air conditioning device, the air conditioning device being fixable with a fixing part to a covering part of the enclosure or equipment cabinet and at least one air distribution space can be sealed, characterized in that a watertight, linear sealing of the air distribution space is provided and that at least one sealing frame is located on the fixing part of the air conditioning device and/or on the covering part of the enclosure or equipment cabinet and cooperates with a seal. Appropriate and advantageous developments are given in the description relative to the drawings.

A fundamental idea of the invention is to obtain a linear sealing of the connecting area between the air conditioning device and the covering part of an equipment cabinet with the aid of at least one sealing frame and an associated elastic seal.

According to the invention it is possible to provide a sealing frame on the air conditioning device, appropriately on a fixing part intended for the engagement or connection to the covering part of the equipment cabinet and which as a rule is an enclosure part, e.g. of a heat exchanger. It is alternatively possible to provide the covering part of the equipment cabinet, e.g. a door, with a sealing frame, which cooperates with a corresponding elastic seal on the sealing frame or on the air conditioning device. The sealing frame can be rectangular, polygonal, circular or can be constituted by elements with combined shapes.

In a particularly preferred embodiment a sealing frame is provided both on the air conditioning device and on the covering part of the equipment cabinet and with elastic seals ensures an uninterrupted, linear and adequately strong local compression of the seals when the air conditioning device is joined to the covering part or some other enclosure component of the equipment cabinet.

Importance is attached to linear contact through the construction of the at least one sealing frame on a corresponding fixing part of the air conditioning device and/or the covering part of the equipment cabinet.

A watertight connection of IP protection type ×5 is also obtained if additionally in the vicinity of the air supply and/or removal openings of the covering part a cover is provided. Said cover is advantageously positioned between the fixing part of the air conditioning device and the covering part of the equipment cabinet and is provided with perforations in the vicinity of the air distribution spaces for air supply or removal purposes. To bring about an unending seal of the air distribution spaces, the sealing frame of the fixing part of the air conditioning device and the sealing frame of the covering part marginally engage on the cover in each case by means of the accompanying seal. Thus, advantageously on both sides of the cover a linear sealing action is brought about and a seal against humidity corresponding to the requirements is ensured.

However, an air distribution space is also designed if the sealing edge and the seal produce a spacing between the covering part and the air conditioning device without covers being located between them. In the simplest case the seal and sealing frame run parallel to the boundary lines of the air entrance and exit regions.

A further advantage of the cover, which is appropriately detachably fixable to the covering part, is the construction as a component for EMC shielding of the equipment and components received in the equipment cabinet. It is also possible to marginally provide the cover with EMC spring elements in order to produce an electrical connection with the covering part and/or the air conditioning device.

The sealing frames project at right angles from the fixing part of the air conditioning device and from the covering part of the equipment cabinet and a sealing edge at the free end extends up to the associated seal, which can be located on the inside or outside of the cover. Alternatively a sealing rope, e.g. a lip-type seal, can also be positioned in the area of the sealing edge of one or both sealing frames and can sealingly engage on the cover. In the area of the sealing edge, the sealing frame can have a groove for receiving and holding a sealing profile or section.

However, it is also possible to construct the cover for receiving a sealing profile or to apply a foam seal, e.g. a two-component polyurethane foam. Such a seal can advantageously be constructed for EMC shielding purposes and can e.g. contain metal particles.

Appropriately fixing struts are provided for fixing the cover and can be positioned in a detachable manner on the covering part.

The sealing frame of the covering part can be integrated into said fixing struts, which are arranged vertically and horizontally with respect to a surrounding frame. It is particularly appropriate that the air conditioning device can be fixed, e.g. with the aid of a fixing frame to the fixing struts. With a correspondingly dimensioned sealing frame located on the air conditioning device, it is then possible to bring about the necessary linear sealing action when fixing takes place.

Fundamentally the production of the air conditioning device sealing frame can be integrated into the overall production of e.g. the fixing part. An integration of the shaped element in master pattern parts is particularly advantageous in the case of plastic mouldings or injection mouldings, as well as metal castings and extruded sections.

Alternatively the sealing frame of the fixing part of the air conditioning device can be constructed as an angular sealing frame, which engages with a fixing leg on the fixing part and which is e.g. fixed by spot welding and subsequently sealed.

The fixing of the air conditioning device takes place with a fixing frame, which appropriately has a fixing flange running parallel to the cover and which together with the latter can be fixed to the given fixing strut of the covering part.

Through the air conditioning device being provided with a sealing frame in the area of its fixing part and whose linear sealing edge cooperates with an elastic seal, particularly on an outer surface of a cover, an air conditioning device can be fitted without problem and in situ to a covering part of an equipment cabinet or enclosure and can also be replaced and in each case the necessary watertight connection is obtained.

BRIEF DESCRIPTION OF THE DRAWINGS

The invention is described in greater detail hereinafter relative to the attached diagrammatic drawings, wherein show.

DETAILED DESCRIPTION OF THE PREFERRED EMBODIMENTS

Figure 1:
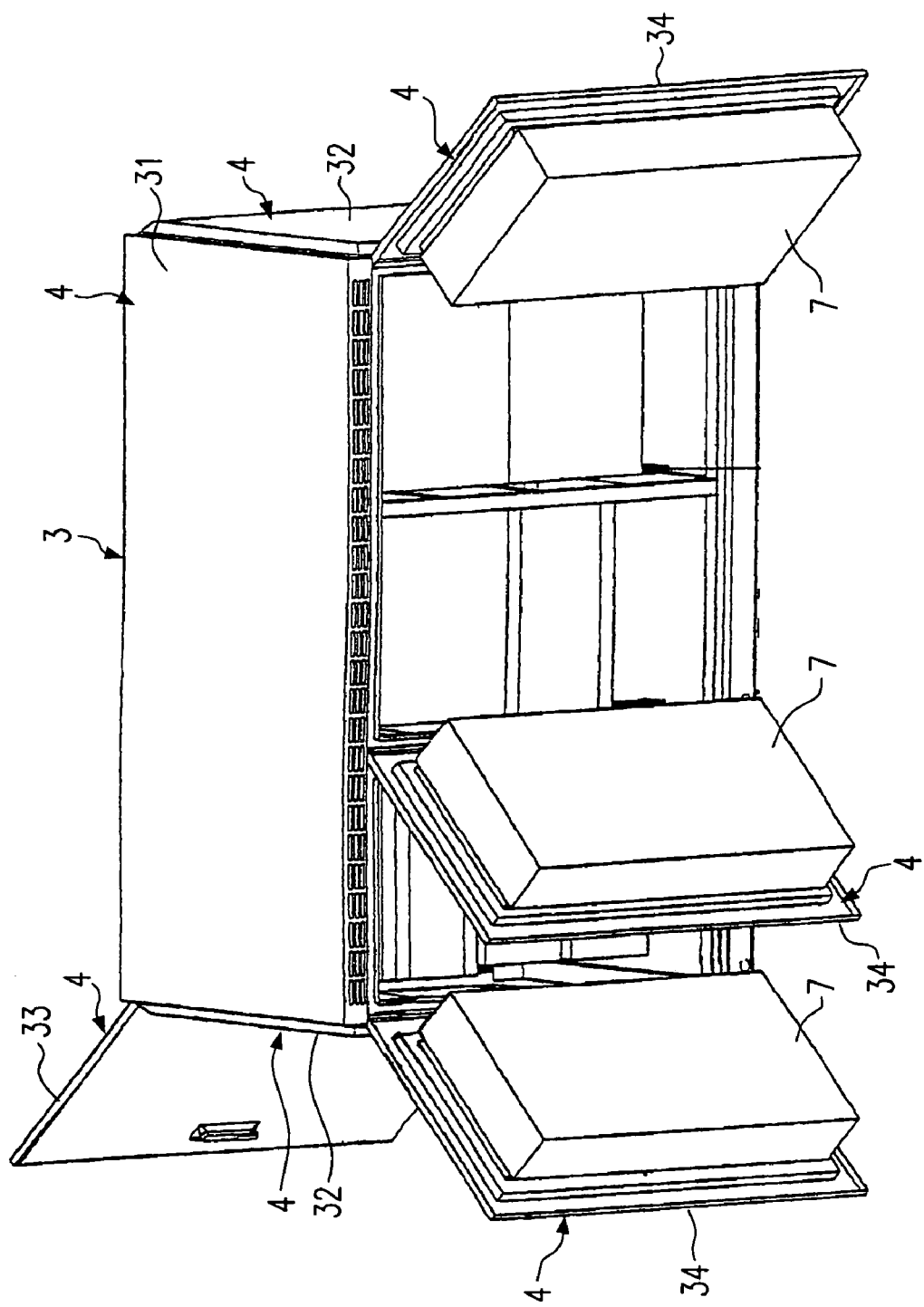
FIG. 1 An equipment cabinet with air conditioning devices in the vicinity of the doors.

FIG. 1 shows an equipment cabinet 3 for an outside area with a watertight, upper cover 31, two side panels 32, rear doors 33, whereof one door 33 is opened, and three front doors 34 as covering parts 4. The front doors 34 are shown in the open position and in each case have a heat exchanger as an air conditioning device 7, but this is only shown diagrammatically without air passage openings.

Figure 2:
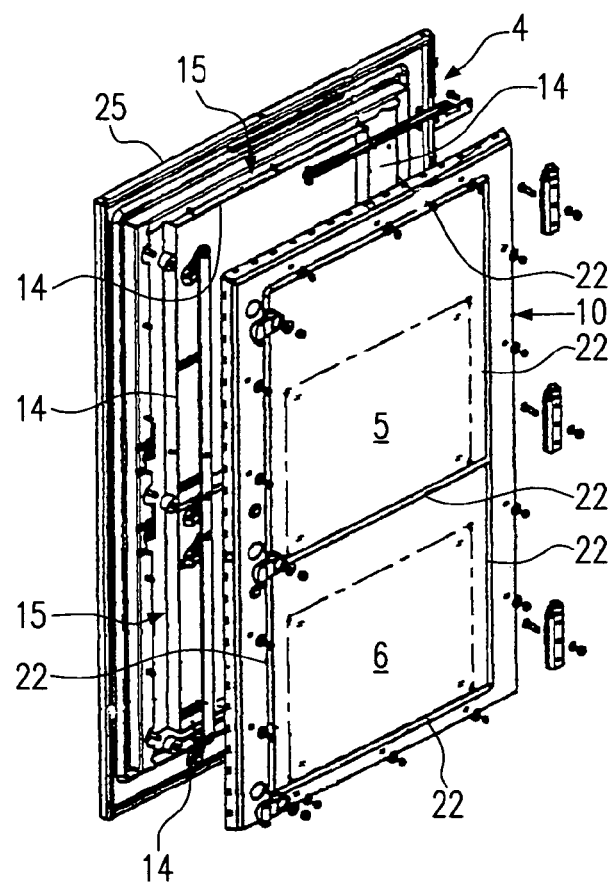
FIG. 2 An exploded view of an equipment cabinet door constructed for the fitting of an air conditioning device.
Figure 3:
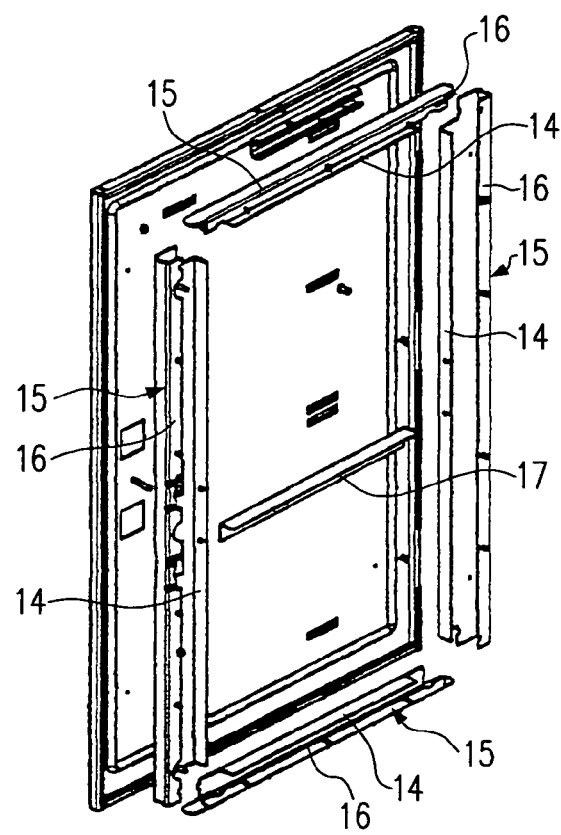
FIG. 3 The door according to FIG. 2, but without a cover.

FIG. 2 shows as a covering part 4 a door, which is constructed for the fitting of a not shown air conditioning device. The door 4 has a door leaf 25 to which is fixed in an unending, all-round manner a sealing frame 14. In the present embodiment the sealing frame 14 is integrated into fixing struts 15, which are shown in detail in FIG. 3, and oriented perpendicular to the door leaf 25 in the direction of a cover 10. The sealing frame 14 forms one leg of the U-shaped, vertically and horizontally positioned fixing struts 15. On the in each case outer, second leg of the U-shaped fixing struts is additionally formed a fixing flange 16 running parallel to the door leaf 25 and used for fixing the cover 10 (FIGS. 2 and 4) and the air conditioning device 7 (FIG. 4).

FIG. 2 shows in broken line form on cover 10 an upper air distribution space 5 and a lower air distribution space 6. The cover 10 is air-permeable and e.g. in perforated form within the air distribution spaces 5, 6 in order to permit an air supply and air removal to or from the not shown reception space. For sealing the two air distribution spaces 5, 6, the sealing frame 14 has a horizontally positioned sealing angle 17 linking the two vertically oriented sealing frames 14 and cooperating with a complimentary seal 24 on the inside of the cover 10 (cf. FIG. 5).

Figure 4:
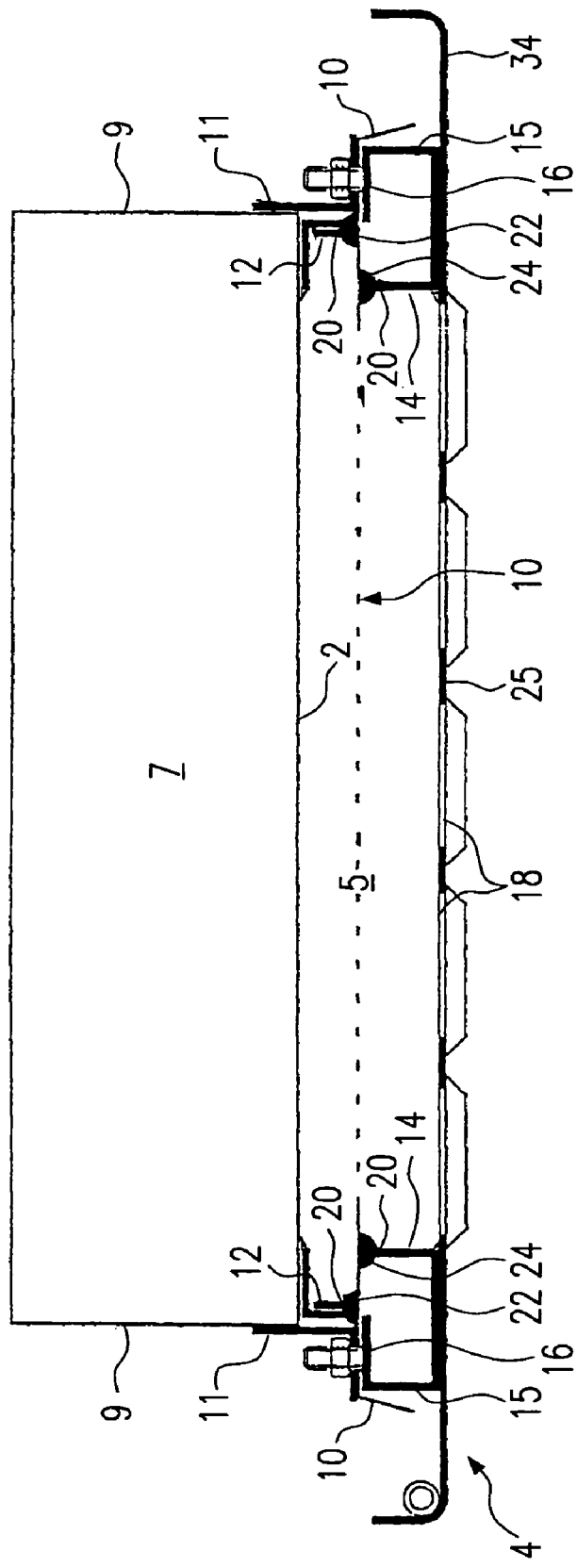
FIG. 4 A cross-section through a door of an equipment cabinet with a fitted air conditioning device.
Figure 6:
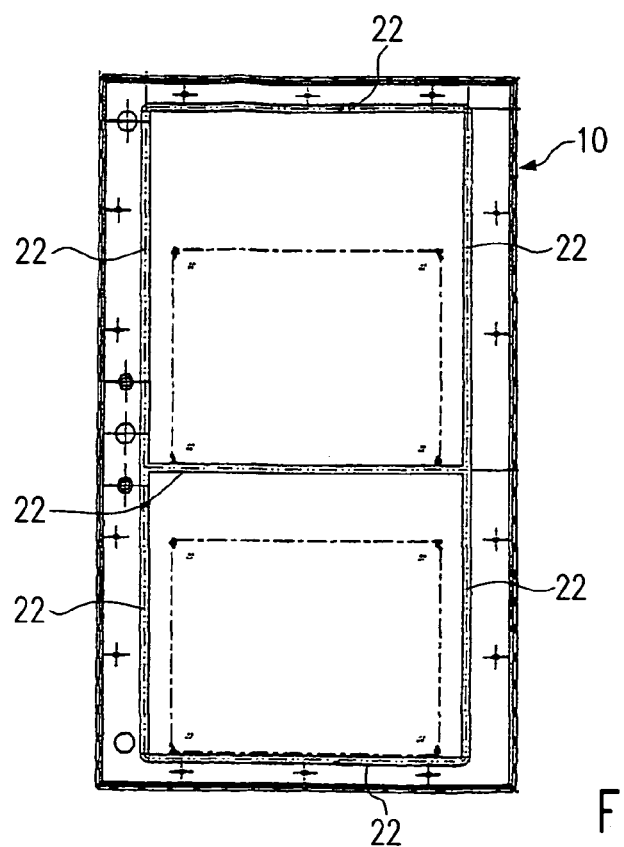
FIG. 6 A view of the outside of the door cover according to FIG. 5.

To the outside of the cover 10 according to FIG. 2 is fitted a seal 22, whose arrangement corresponds to the sealing frame 12 on the not shown, air conditioning device to be fitted, so as to bring about a linear, watertight sealing action (cf. also FIGS. 4 and 6).

FIG. 4 shows a preferred sealing arrangement of an equipment cabinet, where the covering part 4 is constituted by a door. In the vicinity of the air passage openings 18 of the door leaf 25, which in the present case are in the form of "gills", an air conditioning device 7 is fitted to the inside. Between the air conditioning device 7 and the covering part 4 is placed a cover 10 running parallel to the door leaf 25 of the covering part 4 and which is air-permeable in the vicinity of the air distribution spaces 5, 6, whereof the air distribution space 5 is shown. With the aid of the cover 10, a sealing frame 12 on the air conditioning device 7 and a sealing frame 14 on the covering part 4, as well as seals 22, 24 cooperating with the sealing frames 12, 14, a watertight, linear sealing of the air distribution spaces 5, 6 and the necessary IP protection level ×5 are ensured.

In the present embodiment the seals 22, 24 on the inside and outside of the cover 10 are foamed on as a two-component polyurethane foam and, after fixing the air conditioning device 7, are compressed by sealing edges 20 on sealing frames 12, 14 onto the covering part 4 over the entire length of said sealing edge 20. This leads to a durable sealing effect, which complies with the requirements of the equipment cabinet and enclosure user.

FIG. 4 shows the construction of the fixing struts 15 on the inside of the covering part 4, into which is internally integrated the sealing frame 14 with sealing edge 20. The fixing struts 15 with sealing frame 14 are cross-sectionally approximately U-shaped and provided with a right-angled, inwardly bent fixing flange 16. In the area of the fixing flange 16 the cover 10 and the air conditioning device 7 are fixed with the aid of a fixing frame 11, which is located on the four side panels 9 of the air conditioning device 7. The sealing frame 12 of the air conditioning device 7 is marginally fitted to a fixing part 2 of the air conditioning device 7 and cooperates with the accompanied seal 22 on cover 10. FIG. 4 shows the double linear seal on the inside and outside of the additional cover 10 between the air conditioning device 7 and the covering part 4, which leads to an improved seal against water and in particular of IP protection type ×5 or higher or comparable demands made in international standards.

Figure 5:
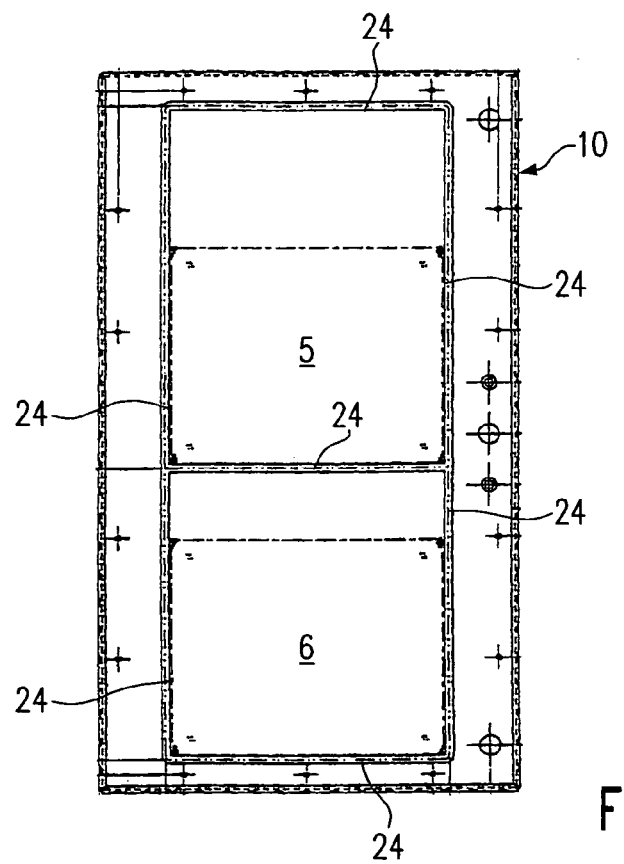
FIG. 5 A view of the inside of a door cover.

FIGS. 5 and 6 show a cover 10 with a view of the inside and the seal 24 (FIG. 5) there, as well as the outside and the seal 22 fitted there (FIG. 6). As in FIG. 2, the air distribution spaces 5, 6 are shown in dot-dash line form. In this area of the air distribution spaces 5, 6 the cover 10 is constructed for air supply or removal purposes and is e.g. provided with not shown perforations. The seals 22, 24 are arranged in complimentary manner to the sealing frames 12, 14 and bound the air distribution spaces 5, 6 under a linear seal.

Figure 7:
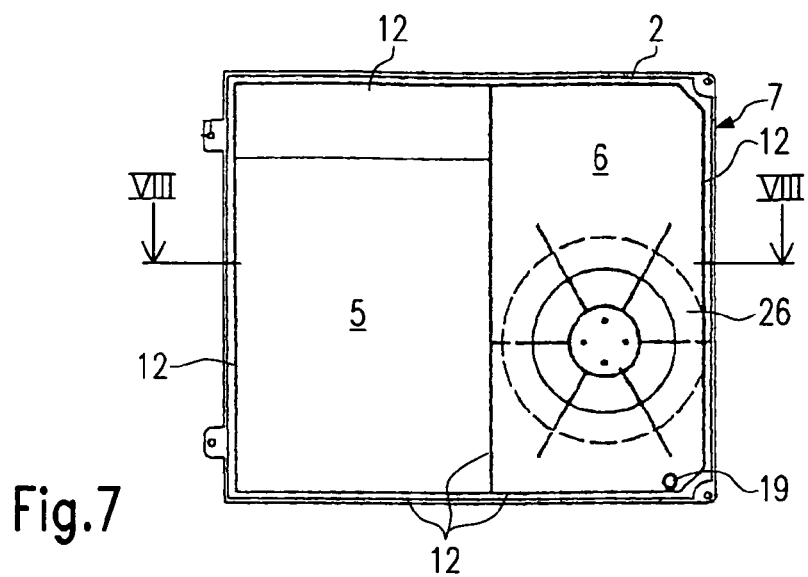
FIG. 7 A plan view of an air conditioning device with fixing part.
Figure 8:
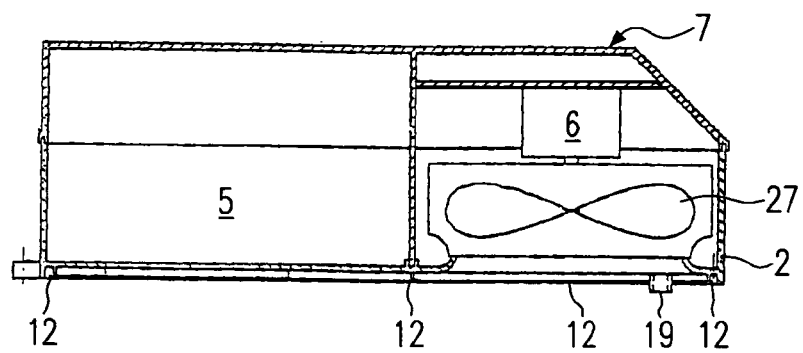
FIG. 8 A cross-section along line VIII—VIII of FIG. 7.
Figure 9:
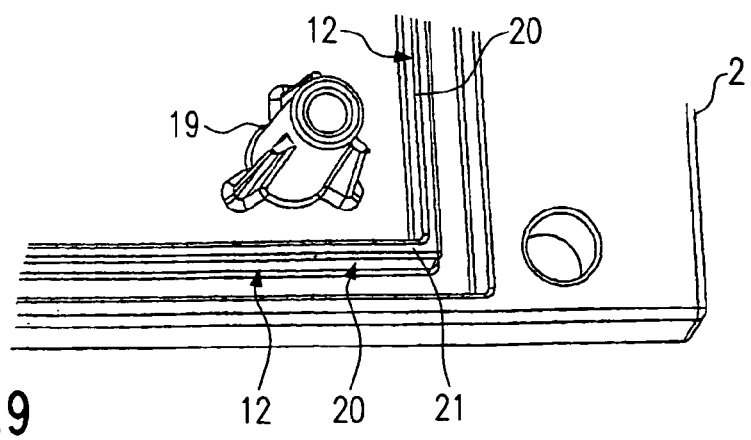
FIG. 9 A larger scale detail of the fixing part according to FIG. 7.

FIGS. 7 to 9 show another embodiment for an attachable air conditioning device 7. In the embodiment the sealing frame is integrated constructionally and materially in the plastic enclosure of the air conditioning device. FIG. 7 shows the fixing part 2 with a sealing frame 12, which is marginally and centrally constructed for sealing a left and right-hand air distribution space 5, 6. In the vicinity of the right-hand air distribution space 6 is provided a covering grid 26 of a fan 27 (cf. FIG. 8) and in a lower area a discharge opening 19 for collected water (cf. also FIG. 9). The integrated construction of the sealing frame 12 can in particular be gathered from the cross-sectional representation of FIG. 8 and the larger scale detail view of FIG. 9. The sealing frame 12 with sealing edge 20 and groove 21 can receive a not shown sealing line.

The invention claimed is:

1. Sealing arrangement of an enclosure or equipment cabinet and an attachable air conditioning device, the enclosure or equipment cabinet having a covering part, the air conditioning device having a fixing part, the air conditioning device being fixed with the fixing part to the covering part of the enclosure or equipment cabinet, whereby at least one air distribution space is formed, wherein:

for a watertight, linear, and uninterrupted sealing of the air distribution space at least one sealing frame and at least one seal is provided and wherein the sealing frame is located at least on the fixing part of the air conditioning device or on the covering part of the enclosure or equipment cabinet and cooperates with the corresponding seal;

a cover is provided in the air distribution space or spaces and is positioned between the fixing part of the air conditioning device and the covering part of the enclosure or equipment cabinet;

wherein the sealing frames and seals are constructed for engagement on the cover;

wherein the cover is detachably fixed to the covering part; and wherein fixing struts are arranged vertically and horizontally on the covering part of the enclosure or equipment cabinet, wherein the cover can be fixed to the fixing struts, and wherein the fixing struts of the covering part are cross-sectionally U-shaped and the sealing frame is integrated into the fixing struts.

2. Sealing arrangement according to claim 1, wherein externally the fixing struts have a fixing flange running parallel to the covering part of the enclosure or equipment cabinet and to the cover and wherein the cover and air conditioning device can be fixed to the fixing flange.

3. Sealing arrangement according to claim 2, wherein a fixing frame is provided and the air conditioning device can be fixed with the aid of the fixing frame to the fixing struts of the covering part of the enclosure or equipment cabinet.

4. Sealing arrangement of an enclosure or equipment cabinet and an attachable air conditioning device, the enclosure or equipment cabinet having a covering part, the air conditioning device having a fixing part, the air conditioning device being fixed with the fixing part to the covering part of the enclosure or equipment cabinet, whereby at least one air distribution space is formed, wherein:

for a watertight, linear, and uninterrupted sealing of the air distribution space at least one sealing frame and at least one seal is provided and wherein the sealing frame is located at least on the fixing part of the air conditioning device or on the covering part of the enclosure or equipment cabinet and cooperates with the corresponding seal; and wherein the at least one sealing frame and at least one seal provide an IP protection value of at least ×5.

5. An enclosure or equipment cabinet and a sealing arrangement for sealing a connecting area between the enclosure or equipment cabinet and conditioning device attachable thereto at the connecting area, the air conditioning device having a fixing part, wherein:

the enclosure or equipment cabinet has a covering part, the air conditioning device being fixed with the fixing part to the covering part of the enclosure or equipment cabinet, whereby at least one air distribution space is formed, wherein fixing struts are arranged on the covering part of the enclosure or equipment cabinet;

for a watertight, linear, and uninterrupted sealing of the connecting area and the air distribution space, at least one sealing frame and at least one seal are provided, the sealing frame being located on at least one of the fixing part of the air conditioning device and en the covering part of the enclosure or equipment cabinet at the connecting area and cooperating with the corresponding seal; and the fixing struts of the covering part are cross-sectionally U-shaped and the sealing frame is integrated into the fixing struts.

6. Enclosure or equipment cabinet and sealing arrangement according to 5, wherein a cover is provided in the air distribution space or spaces and is positioned between the fixing part of the air conditioning device and the covering part of the enclosure or equipment cabinet, and wherein the sealing frames and seals are constructed for engagement on the cover.

7. Enclosure or equipment cabinet and sealing arrangement according to claim 6, wherein the cover is detachably fixed to the covering part.

8. Enclosure or equipment cabinet and sealing arrangement according to claim 6, wherein the cover is perforated in the area of the air distribution spaces.

9. Enclosure or equipment cabinet and sealing arrangement according to claim 6, wherein the cover is constructed as a component for electromagnetic shielding purposes.

10. Enclosure or equipment cabinet and sealing arrangement according to claim 7, wherein the fixing struts are arranged vertically and horizontally on the covering part of the enclosure or equipment cabinet and wherein the cover can be fixed to the fixing struts.

11. Enclosure or equipment cabinet and sealing arrangement according to claim 6, wherein the sealing frames project almost at right angles from the fixing part and covering part and have a sealing edge extending almost up to the cover.

12. Enclosure or equipment cabinet and sealing arrangement according to claim 11, wherein the seals are fitted to the sealing frames.

13. Enclosure or equipment cabinet and sealing arrangement according to claim 11, wherein the seals are fitted in complementary manner to the sealing frames on the inside and outside of the cover.

14. Enclosure or equipment cabinet and sealing arrangement according to claim 11, wherein the seals are sealing profiles, which are detachably held on the sealing frames.

15. Enclosure or equipment cabinet and sealing arrangement according to claim 11, wherein the seals are sealing profiles, which are detachably held on the cover.

16. Enclosure or equipment cabinet and sealing arrangement according to claim 13, wherein as seals foamed polyurethane is directly applied by extrusion to the cover and following a foaming process a continuous seal is formed.

17. Enclosure or equipment cabinet and sealing arrangement according to claim 6, wherein the sealing frame is integrated into the fixing part of the air conditioning device.

18. Enclosure or equipment cabinet and sealing arrangement according to claim 5, wherein two sealing frames and two corresponding seals are provided.

* * * * *